United States Patent [19]

Rösler et al.

[11] 4,366,396
[45] Dec. 28, 1982

[54] SEMICONDUCTOR CIRCUIT FOR TRANSFORMING SEQUENCES OF PERIODIC A-C SIGNALS

[75] Inventors: Helmut Rösler; Otto Mühlbauer, both of Munich; Klaus D. Bigall, Vaterstetten, all of Fed. Rep. of Germany

[73] Assignee: Siemens Aktiengesellschaft, Berlin and Munich, Fed. Rep. of Germany

[21] Appl. No.: 137,420

[22] Filed: Apr. 4, 1980

[30] Foreign Application Priority Data

Apr. 25, 1979 [DE] Fed. Rep. of Germany ....... 2916765

[51] Int. Cl.³ .................... H03K 5/08; H03K 5/156
[52] U.S. Cl. .................... 307/261; 307/264; 307/555; 328/14; 328/168
[58] Field of Search ......... 307/264, 540, 555, 557, 307/567, 568, 261; 328/14, 168, 169, 171, 172; 84/1.09, 1.13, 1.21, 1.26

[56] References Cited

U.S. PATENT DOCUMENTS 3,810,035  5/1974  Gundry .................. 307/264
4,234,807 11/1980  Esser et al. ............. 307/264

OTHER PUBLICATIONS

D. Ulrich, Grundlagen der Digital-Elektronik und digitalen Rechentechnik, second edition, Munich 1975, p. 176.

Primary Examiner—John Zazworsky
Attorney, Agent, or Firm—Herbert L. Lerner; Laurence A. Greenberg

[57] ABSTRACT

Semiconductor circuit for transforming sequences of periodic a-c voltage signals, including a signal input, a signal output, n pair of identical first and second transistors each having a control electrode and first and second current-carrying terminals, the first current-carrying terminal of each of the first transistors being connected to the signal input, the second current-carrying terminal of each of the first transistors and the corresponding second current-carrying terminal of each of the second transistors of each of the transistor pairs being connected together, n different combinations of resistances each being connected between a connection of the second current-carrying terminals of a transistor pair and the signal output, the combinations of resistances of each transistor pair together forming a resistance network, the first current-carrying terminal of each of the second transistors being at a common operating potential which is different from ground, and a digital counter having n counting stages and being driven by a clock generator with counting pulses, the digital counter being connected for driving the control electrodes of each transistor, the digital counter stages having signal outputs connected to each transistor pair.

8 Claims, 1 Drawing Figure

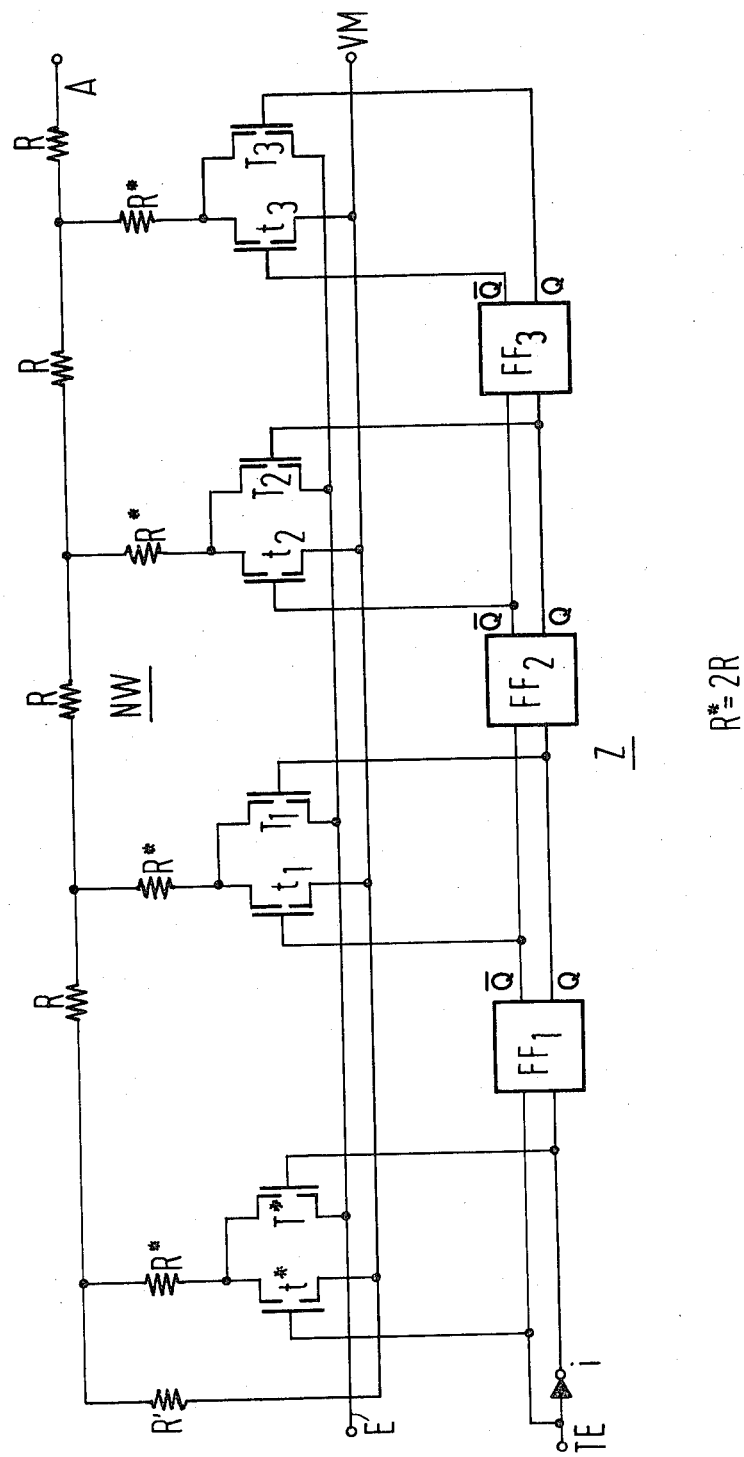

SEMICONDUCTOR CIRCUIT FOR TRANSFORMING SEQUENCES OF PERIODIC A-C SIGNALS

The invention relates to a semiconductor circuit for transforming sequences of periodic a-c voltage signals with a signal input, a circuit section causing the transformation, and a signal output.

Circuits of this type are ordinarily used for modulating a-c voltage signals and are generally customary in engineering.

In practice, however, for instance, in the operation of electronic musical instruments, and in equipment for speech synthesis, etc., the problem can arise of transforming electrical a-c signals which may be composed of periodic oscillations of different kinds, such as, of sinusoidal oscillations, square waves or sawtooth waves, for instance, in such a manner that the amplitude of the individual waves increases to larger and larger values, starting from a very small value slowly to a maximum and then, possibly after dwelling at the maximum, declines again monotonically to a vanishingly small value. In addition, it is important in this connection that the amplitude change is not referred to the reference potential (ground) but to a higher potential VM which lies, for instance, in the middle between the reference potential and the other main operating potential. Such a modulation would be indicated, for instance, when the tone in electronic musical instruments is switched on because, as investigation with a Fourier analysis shows, it is free of the d-c step which otherwise occurs when the oscillations set in or decay, so that the disagreeable click can be avoided in this manner.

It is accordingly an object of the invention to provide a semiconductor circuit for transforming sequences of periodic a-c signals which overcomes the hereinaforementioned disadvantages of the heretofore known devices of this general type, and which is a monolithically integrable semiconductor circuit which is suitable for delivering a-c voltage or a-c voltage pulse sequences shaped as indicated above.

With the foregoing and other objects in view there is provided, in accordance with the invention, a semiconductor circuit for transforming sequences of periodic a-c voltage signals, comprising a signal input, a circuit section forming the transformation, a signal output, n pair of identical first and second transistors each having a control electrode and first and second current-carrying terminals, the first current-carrying terminal of each of the first transistors being connected to the signal input, the second current-carrying terminal of each of the first transistors and the corresponding second current-carrying terminal of each of the second transistors of each of the transistor pairs being connected together, n different combinations of resistances each being connected between a connection of the second current-carrying terminals of a transistor pair and the signal output, the combinations of resistances of each transistor pair together forming a resistance network, the first current-carrying terminal of each of the second transistors being at a common operating potential which is different from ground, and a digital counter having n counting stages and being driven by a clock generator with counting pulses, the digital counter being connected for driving the control electrodes of each transistor, the digital counter stages having signal outputs connected to each transistor pair in a manner that is different from case to case.

The constant operating potential VM which is different from the reference potential (ground), lies between the reference potential tied to ground and the highest operating potential used in the operation of the digital counter, particularly in the middle between the two potentials.

In accordance with another feature of the invention, the transistors of each transistor pair are bipolar transistors of the same type, the control electrodes of each transistor being connected to one of the outputs of a counting stage of the digital counter, the collector electrode of each transistor being the second electrode connected to the combination of resistances, and the emitter electrode being the first electrode.

In accordance with a further feature of the invention, the transistors are identical MIS field effect transistors, especially MOS field effect transistors, and the gate leads of the field effect transistor are controllingly connected to the outputs of the counting stages of the digital counter.

In accordance with an additional feature of the invention, the digital counter is a binary counter and each of the counting stages is a flipflop cell, especially a toggle flipflop cell. It should be noted also in this connection that in this case the flipflop cells forming the counting stages of the digital counter are composed of logic gates (NOR and NAND gates), which have as their main components bipolar transistors and possibly also diodes.

In accordance with an added feature of the invention, the counter has an input connected to the counting stages and the counting stages have first and second outputs, counting in direction from the counter input, the control electrode of the first transistor of each transistor pair being connected to the first output of each corresponding counting stage and the control electrode of the second transistor of each transistor pair being connected to the second output of the corresponding counting stage.

In accordance with yet another feature of the invention, the counting stages have first and second inputs; and counting in direction from the counter input, the first and second outputs of each counting stage are connected to the respective first and second inputs of the next following counting stage, and including an inverter, the counting pulses provided by the clock generator being fed directly to the first input of the first counting stage, and through the inverter to the second input of the first counting stage.

In accordance with yet a further feature of the invention, one of the outputs of the counting stages has a ONE state immediately prior to the start of the binary counter, and the first transistors of the transistor pairs are connected to the one of the outputs.

In accordance with yet an additional feature of the invention, there are provided supplemental resistors, the resistance network including a resistor chain formed of $n+1-i$ series-connected identical individual resistors, each $i^{th}$ transistor pair, counting in direction from the signal input, being connected through the chain and one of the supplementary resistors to the signal output, the last one of the resistors leading to the signal output being connected to the next following transistor pair after the $i^{th}$ transistor pair.

In accordance with yet an added feature of the invention, there is provided a bridging resistor connected between the common operating potential and an end of the chain furthest from the signal output, the chain having n+1 or n+2 identical individual resistors.

In accordance with still a further feature of the invention, each of the supplemental resistors and the bridging resistor have twice the resistance value of the individual resistors of the chain.

In accordance with still an additional feature of the invention, there is provided a further transistor pair connected to the counter input and to the output of the inverter, the further transistor pair being a first and a second transistor each having a first and a second current-carrying terminal, the second terminals of the first and second transistors of the further transistor pair being connected together to the resistor chain which is in turn connected to the signal output, a further supplementary resistor connected between the resistor chain and the further transistor pair, the first current-carrying terminal of the first transistor of the further transistor pair being connected to the signal input, and the first current carrying terminal of the second transistor of the further transistor pair being connected directly to the operating potential.

In accordance with still an added feature of the invention, the clock generator is an oscillator capable of delivering periodic counting pulses.

In accordance with again another feature of the invention, the frequency of the counting pulses is lower than the frequency of the pulses of the signal sequences to be applied to the signal input.

In accordance with again a further feature of the invention, the digital counter is a bidirectional counter, particularly in accordance with the device disclosed in U.S. patent application Ser. No. 051,675.

In accordance with again an added feature of the invention, there is provided a semiconductor module in monolithic MIS semiconductor technology combined with the circuit.

In accordance with a concomitant feature of the invention, there is provided a semiconductor module in bipolar technology combined with the circuit.

Other features which are considered as characteristic for the invention are set forth in the appended claims.

Although the invention is illustrated and described herein as embodied in a semiconductor circuit for transforming sequences of periodic a-c signals, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the single FIGURE of the drawing, which is a schematic circuit diagram in accordance with the invention, in which the transistors are identical MIS field-effect transistors, espcially enhancement transistors.

Referring now particularly to the single FIGURE of the drawing, it is seen that the subscript "i" runs from 1 to n, where n is the total number of the counting stages Z and the count begins with the first counting stage $FF_1$, addressed by the counting pulses directly, and progresses in the order of the counting stages $FF_i$ in the chain of counting stages forming the counter. The transistor pair belonging to the $i^{th}$ counting stage $FF_i$ comprises the two identical MIS field effect transistors $T_i$ and $t_i$ where in accordance with the chosen nomenclature the transistor $T_i$ is considered as the first transistor and the transistor $t_i$ is considered as the second transistor. According to the invention, the two transistors $T_i$ and $t_i$ are combined to form the respective transistor pair by connecting their drain leads together and tying them through a combination $R_i$ of resistors associated with the respective transistor pair to the signal output A of the circuit.

According to the invention, the source lead of the first transistor $T_i$ of the $i^{th}$ transistor pair is further connected to the signal input E of the circuit which is addressed by the pulse sequences to be formed, and the source lead of the second transistor $t_i$ is connected to a supply input acted upon by an intermediate operating potential VM which is different from the reference potential and lies between the reference potential and the highest operating potential required for the operation of the digital counter Z.

In the embodiment example shown in the drawing, the digital counter Z is a binary counter so that the individual counting stages $FF_i$ each comprise a flipflop cell, especially a toggle flipflop cell. Accordingly, each counting stage $FF_i$ has two signal inputs and two signal outputs, the outputs being designated Q and $\overline{Q}$. The prevailing counter contents are provided by the totality of the outputs Q and $\overline{Q}$, observing the order i of the flipflop cells, where $\overline{Q}$ represents the inverted count and Q the count corresponding to the number of counting pulses fed in so far. The counting pulses are fed through the counting input TE of the binary counter Z directly to one input, and through an inverter I to the other information input of the first flipflop cell $FF_1$ of the counter chain Z. Each of the two outputs Q and $\overline{Q}$ of the first flipflop cell $FF_1$ are connected to one of the two information inputs of the second flipflop cell $FF_2$. In general each of the two outputs of the $i^{th}$ flipflop cell $FF_i$ are connected with one of the two information inputs of the following flipflop cell $FF_{i+1}$.

If a counter Z of such construction is used, it is advantageous to provide still another transistor pair T*, t* which is addressed in a manner similar to that of the other transistor pairs $T_i$, $t_i$ by the signal input E and the potential VM, and is connected to the output A of the circuit, while the input TE is directly provided for the counting pulses and the inverter I, respectively. Accordingly, the first transistor T* of this transistor pair is connected with its drain lead and the drain lead of the second identical transistor t* through a further resistance combination to the output A of the circuit. Meanwhile the source lead of the first transistor T* is connected to the signal input E of the circuit and the source lead of the second transistor t* is connected to the intermediate operating potential VM. The gate of the first transistor T* is controlled by the output of the inverter I and the gate of the second transistor t* is controlled directly by the counting input TE of the binary counter Z.

The basic component of the resistance network NW is a resistor chain which comprises n equal resistors R and is terminated at one end by the signal output A of the circuit. The resistor chain is connected at its other end, through a bridging resistor R' to the intermediate operating potential VM provided to act on the source terminal of the second transistor $t_i$ of the transistor pairs $T_i$, $t_i$. Between each two adjacent individual resistors R of the resistor chain as well as between the bridging resistor R' and the individual resistors R of the resistor chain adjacent thereto, a respective circuit node is provided. From the circuit node a conducting connection to the two transistors $T_i$, $t_i$ of the $i^{th}$ transistor pair is established through a supplementary resistor $R^*$. The connection is made in such a way that in each case the series circuit comprising a supplementary resistor $R^*$ and $(n+1-i)$ individual resistors R is connected between the drain leads of the two transistors $T_i$, $t_i$ of the transistor pair formed by the $i^{th}$ counting stage $FF_i$ of the binary counter Z and the output A of the circuit.

It should be mentioned that the equal supplementary resistors $R^*$ are adjusted to twice the value of the individual resistors R of the resistance chain and that therefore $R^*=2R$. The bridging resistor $R'$ is advantageously adjusted so that $R'=R^*$.

If in addition to the normally needed transistor pairs, a further transistor pair $T^*$, $t^*$ is provided and connected in the manner hereinafore described to the counting input TE of the binary counter Z, to the intermediate operating potential VM and to the signal input E, then the chain of equal resistors R must be extended by a further resistor R, as can be seen in the drawing. Then, the combined drain leads of the two transistors of the first transistor pair $T_1$, $t_1$ are no longer connected to the end of the chain formed of the resistors R, but between the last two of these resistors R of the resistor chain, as seen from the direction of the signal output A. The drains of the two transistors $T^*$ and $t^*$ of the additional transistor pair are then connected, again through a supplementary resistor $R^*$, to the circuit node between the last resistor R of the chain and the bridging resistor $R'$.

The pulse sequences to be fed to the input E are identical pulses, such as sine pulses or square pulses or sawtooth pulses, for instance. Their frequency is set to a higher value than the frequency of the counting pulses for the input TE of the digital counter Z, which advantageously also arrive periodically.

The following can now be said regarding the heretofore described circuit: through the cooperation between the binary counter Z and the two transistors $T_i$ and $t_i$ of the individual transistor pairs, the pulse sequence of constant amplitude fed-in through the input E is transformed into a pulse sequence which is no longer referred to the reference potential, i.e., gound, but into a pulse sequence which is referred to the intermediate operating potential VM, and can be taken off at the output A of the circuit. If the counter is in the starting position and its count is zero, then the amplitude of the signal appearing at the output A is very small because of the high value of the resistance of the then-governing resistance combination $R_i$. With progressing count, the amplitude of the signals appearing at the output A increases and reaches its maximum value with the maximum of the counter contents. Therefore, a pulse sequence is obtained at the output A, having an envelope which becomes increasingly larger.

If the binary counter Z is constructed in a known manner as a bidirectional counter, the maximum count, after it is reached, can be reduced again successively and thereby also the amplitude of the individual pulses.

In principle, a decimal counter, for instance, or a hexadecimal counter can also be used as the digital counter Z instead of the binary counter. However, the number of transistors required is then accordingly larger due to the more complicated construction of the counter stages.

An oscillator with constant frequency is further provided for driving the binary counter Z with counting pulses. The oscillator preferably furnishes sine waves, having an envelope which can then be transformed by means of the proposed semiconductor circuit. The effect is obviously also provided if the shape of the individual pulses of the pulse sequences to be formed is not sinusoidal but, for instance, rectangular or trapezoidal or sawtooth-shaped. Finally, strict periodicity of the signals to be transformed is not an absolutely necessary condition for the effectiveness of the circuit.

In co-pending U.S. patent application Ser. No. 051,675, filed on or about June 24, 1979, an electronic counter for electrical digital pulses is described. The counter stages of this counter each have a Q-output and a $\overline{Q}$-output, can be switched to operation as a forward counter as well as to operation as a backward counter, and is distinguished by a particularly simple construction of the circuit portion effecting the switching. The bidirectional counter described in this patent application Ser. No. 051,675 is particularly well suited as the binary counter Z according to the present invention.

This is particularly true if the invention is used for the generation of tones in electronic musical instruments, particularly an electronic organ. In such a device, pressure on a key activates an oscillator oscillating at the desired audio frequency, or the respective audio frequency is generated by a frequency divider. The electrical audio signal which is excited and represented by a corresponding wave sequence is then connected immediately upon its occurrence to the signal input E of the semiconductor circuit proposed according to the invention and is provided with gradually increasing amplitudes. When the maximum count is reached, then the further supply of counting pulses is stopped until the key is released. At this instant the supply of counting pulses sets in again, where the amplitude of the electrical tone signal, which had been maintained further by appropriate measures, is reduced by the binary counter which is now switched to operation as a backward counter until it disappears. The oscillator supplying the respective audio frequency is then switched off and is reactivated only when the respective key is pressed again.

As was just indicated, oscillators oscillating in accordance with the tones of the highest octaves may be provided. These then generate electrical oscillations corresponding to the tones of the lower octaves through frequency divider stages. The counting pulses serving for driving the binary counter Z can further be supplied by an oscillator of constant frequency through switchable frequency divider stages to the input TE of the binary counter Z. This makes it possible to also provide nonlinear envelopes for the amplitudes of the signals appearing at the output A.

There are claimed:

1. Semiconductor circuit for transforming sequences of periodic a-c voltage signals, comprising a signal input carrying the signals to be transformed, a signal output, a supply potential input supplying a potential differing from reference potential, a given number greater than one of pairs of identical first and second transistors each having a current input electrode, a current output electrode and a control electrode, a clock controlled input, a chain of flip-flop counters being connected at an end thereof to said clock controlled input and having said given number of counting stages so that said counting stages are disposed at increasingly greater distances from said clock controlled input along said chain in a given direction, said counting stages each having two outputs and each being assigned to a different transistor pair, a bridging resistor, a chain of resistors having said given number of resistors in sequence and having an end connected to said signal output, another end connected to said bridging resistor, and a plurality of divider points each being associated with a counting stage and being disposed between each two resistors so that said divider points associated with said counting stages are disposed at increasingly shorter distances from said signal output along said chain in said given direction, a plurality of additional resistors each being connected to a different one of said divider points, said current input electrode of each of said first transistors being connected to said signal input, said current input electrode of each of said second transistors being connected to said supply potential input and through said bridging resistor to said other end of said chain of resistors leading to said signal output, said current output electrodes of said first and second transistors of each transistor pair being connected together through a different resistor of said plurality of additional resistors to a different divider point, and said control electrodes of each of said transistors of each transistor pair being connected to a different one of said outputs of said counting stage assigned thereto.

2. Semiconductor circuit according to claim 1, wherein said counter stages each have two inputs, each of said outputs of said counter stages being connected to a different one of said inputs of the next stage of said chain starting with a first one of said counting stages, said clock controlled input being directly connected to one of said inputs of said first counting stage, and including an inverter connected between said clock controlled input and the other of said inputs of said first counting stage.

3. Semiconductor circuit according to claim 2, including a further transistor pair of first and second transistors each having current input and output electrodes and a control electrode, a supplementary resistor, said current output electrodes of each of said transistors of said further pair being connected together through said supplementary resistor to a location between said bridging resistor and said other end of said first chain of resistors, said control electrode of said first transistor of said further pair being connected between said inverter and said first counting stage, said control electrode of said second transistor of said further pair being connected between said clock controlled input and said first counting stage, said current input electrode of said first transistor of said further pair being connected to said signal input, said current input electrode of said second transistor of said further pair being connected to said supply potential input and through said bridging resistor to said other end of said first resistor chain connected to said signal output.

4. Semiconductor circuit according to claim 1, wherein said transistors are identical MIS field effect transistors and the control electrodes of said field effect transistors are controllingly connected to said outputs of said counting stages.

5. Semiconductor circuit according to claim 1, wherein said transistors are MOS field effect transistors.

6. Semiconductor circuit according to claim 1, wherein said flipflop counters are toggle flipflop cells.

7. Semiconductor circuit according to claim 1, wherein each of said resistors of said second chain and said bridging resistor have twice the resistance value of the individual resistors of said first chain.

8. Semiconductor circuit according to claim 1 wherein said counters are fed counting pulses, and said signal input has signal sequences with pulses of a given frequency being applied thereto, the frequency of the counting pulses being lower than the frequency of the pulses of the signal sequences to be applied to said signal input.

* * * * *